United States Patent [19]
Walter et al.

[11] Patent Number: 5,879,775
[45] Date of Patent: Mar. 9, 1999

[54] PROTECTIVE INORGANIC AND DLC COATINGS FOR PLASTIC MEDIA SUCH AS PLASTIC CARDS

[75] Inventors: Lee Walter, San Diego; Bradford D. West, La Jolla, both of Calif.

[73] Assignee: Eastman Kodak Compnay, Rochester, N.Y.

[21] Appl. No.: 764,426

[22] Filed: Dec. 12, 1996

[51] Int. Cl.$^6$ ...................................................... B32B 3/02
[52] U.S. Cl. ........................... 428/76; 428/216; 428/336; 428/402; 428/408; 428/698; 428/704; 427/534; 427/563
[58] Field of Search ..................................... 428/216, 336, 428/408, 426, 428, 447, 697, 698, 701, 702, 913, 692, 402, 704; 427/534, 562, 563, 76

[56] References Cited

U.S. PATENT DOCUMENTS

| | | | |
|---|---|---|---|
| 5,190,807 | 3/1993 | Kimock et al. | 428/216 |
| 5,508,368 | 4/1996 | Knapp et al. | 427/534 |
| 5,551,959 | 9/1996 | Martin et al. | 51/295 |
| 5,618,619 | 4/1997 | Petrmichl et al. | 428/334 |
| 5,620,754 | 4/1997 | Turchan et al. | 472/554 |
| 5,635,243 | 6/1997 | Turchan et al. | 427/248 |
| 5,643,343 | 7/1997 | Selifanov et al. | 51/306 |
| 5,648,127 | 7/1997 | Turchan et al. | 427/596 |
| 5,688,738 | 11/1997 | Lu | 503/227 |

*Primary Examiner*—Elizabeth Evans
*Attorney, Agent, or Firm*—William F. Noval

[57] ABSTRACT

A plastic structure comprising:
  a plastic media, such as a plastic card; and
  a thin film amorphous inorganic or DLC coating on the plastic media, the coating being hard, transparent or semi-transparent, and wear resistant.

14 Claims, 4 Drawing Sheets

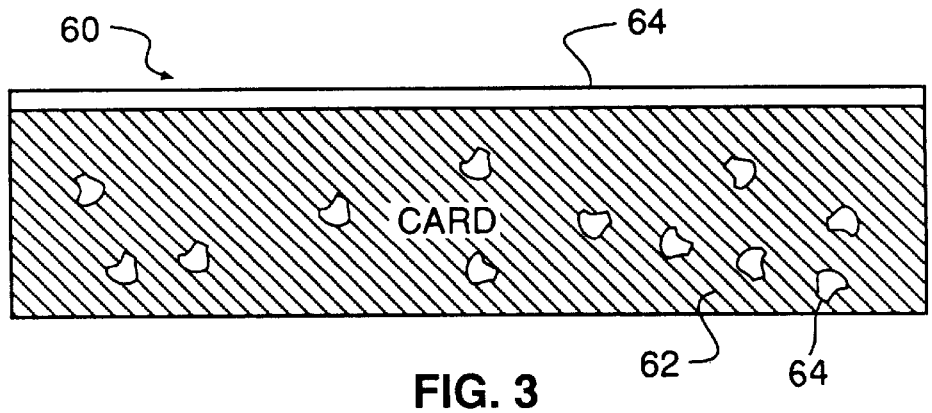
FIG. 3
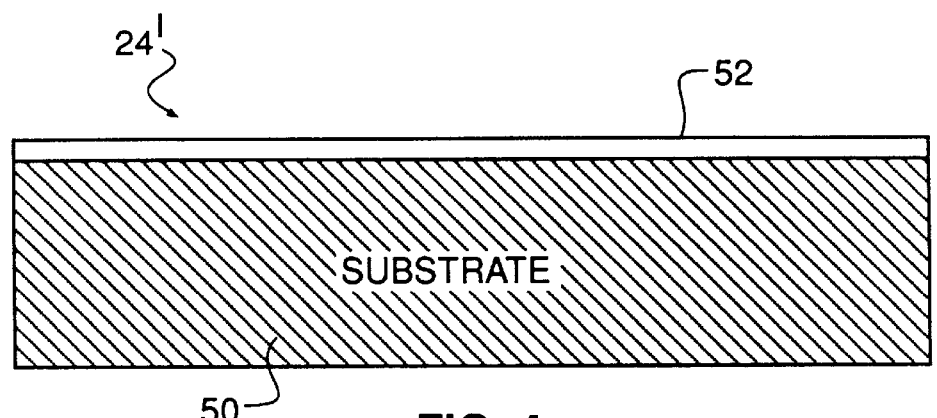
FIG. 4
| | ROOM TEMPERATURE | STANDARD (CONVENTIONAL) |
|---|---|---|
| ELECTRODE | | |
| SUBSTRATE | PLACED ON RF POWERED ELECTRODE | PLACED ON GROUNDED ELECTRODE |
| TEMPERATURE | ROOM TEMPERATURE | HEATED, > 300 C. |
| GAP SPACING BETWEEN ELECTRODES | LOW, 20 MM | HIGH, 50 MM |
| SUBSTRATE | LOW & HIGH MELTING POINT | HIGH MELTING POINT |
| POWER DENSITY (WATT/CM$^2$) | 1.0 - 1.85 | 0.04 - 0.40 |
FIG. 5

| PROTECTIVE COATING | DLC, DOPED DLC | a - SiOX: H, a - SiX: H (X = C, N) |
|---|---|---|
| REACTANTS | $CH_4$, $H_2$, DSH, $N_2$ | DSH, $O_2$, $N_2$ |
| BUFFER GASES | Ar, He | Ar, He |
| GAS FLOW RATES | | |
| $CH_4$ | 50 SCCM | 0.5 - 5 SCCM |
| DSH | 0.5 - 1 SCCM | 1 - 5 SCCM |
| $H_2$ | 100 - 200 SCCM | 50 - 100 SCCM |
| $O_2$ | | 5 - 50 SCCM |
| $N_2$ | 100 SCCM | 100 SCCM |
| Ar | 20 - 100 SCCM | 20 - 100 SCCM |
| POWER DENSITY | 1.5 - 1.7 W/$CM^2$ | > 1.5 W/$CM^2$ |
| SYSTEM PRESSURE ($P_s$) | 100 - 900 mTORR | 75 - 1500 mTORR |
| TEMPERATURE | ROOM TEMP. | ROOM TEMP. |
| PROCESSING LIMITS | | |
| $P_s$ | IF $P_s$ < 100 m TORR - NO DEPOSITION ONLY ETCHING OCCURS | IF $P_s$ < 75 m TORR - ETCHING OCCURS |
| | IF $P_s$ > 900 m TORR - IN PRESENCE OF $H_2$ NO DEPOSITION ONLY ETCHING | IF $P_s$ > 1500 m TORR - POWDER FORMATION, DUST RESULTING IN POOR, SOFT AND ROUGH QUALITY FILM |
| POWER DENSITY | IF < 1.5 WATT/$CM^2$ - NO DEPOSITION IF • < 1.5 WATT/$CM^2$ ETCHING | |

FIG. 6

PROTECTIVE INORGANIC AND DLC COATINGS FOR PLASTIC MEDIA SUCH AS PLASTIC CARDS

FIELD OF INVENTION

This invention relates in general to protective coatings for an object and relates more particularly to protective thin film inorganic or Diamond Like Carbon coatings for a plastic media, such as a plastic card, which have been applied by a metallo-organic plasma enhanced chemical vapor deposition method at or close to room temperature.

BACKGROUND OF THE INVENTION

Security cards are becoming an important information element in this high-tech world. Information is encoded in the form of magnetic signatures and/or optical signatures. The magnetic signatures can be found on either magnetic strips or imbedded within magnetic particles in the body of the card where the card is formed of a solid plastic body with magnetic particles uniformly distributed throughout the body. These cards include credit cards, debit cards, personal ID cards, security passes, and smart cards. The optical signatures are typically found on the surface of the cards in the form of pictorial images such as ID photos, company logos, and emblems. These cards are generally made from plastic resin materials such as polystyrenes, polyesters, polyurethanes, polyamides, PVC (poly-vinyl chloride), polycarbonates, PET (poly-ethylene terphthalate), polyolefins, and PEN (poly-ethylene napthalate). After these resins are plasticized, the plastic material tends to be soft, vulnerable to common mechanical wear and vulnerable to chemical attack. To minimize common mechanical wear, these plastic cards are treated with additional lubricants such as esters, stearates, silicones, polymeric silicones, paraffins, and siloxanes.

Because such cards are of plastic material and any added lubricant tends to have an organic base, they are still vulnerable to common mechanical wear, deterioration and chemical attack in everyday handling, storage, and as they are used in card readers. These problems result in a short lifetime of the plastic card in the loss of and/or distortion of the optical or security information and in many cases loss of encoded magnetic information. Additionally, since optical registrations are placed on the surface, they become susceptible to security tampering.

There is thus a need for improved protection and security which can be addressed by using an effective protective coating that is thin, hard, wearable, impervious to harsh environments. Coatings with such qualities are commonly thin films and are inorganic oxides such as Alumina, inorganic carbides such as Silicon Carbide and Titanium Carbide, inorganic nitrides, such as Silicon Nitride and Titanium Nitride or diamond like such as Diamond Like Carbon (DLC). These coatings, however, when applied as thin films under common standard vacuum processing temperatures and conditions become extremely incompatible with the plastic cards which have melting temperatures which are at or below the processing temperatures for such coatings.

SUMMARY OF THE INVENTION

According to the present invention there is provided a solution to the problems described above.

In general the present invention provides for a thin film protective coating for plastic media, such as a plastic card. The protective coating can be of a variety of protective wear resistant inorganic materials such as inorganic oxides, nitrides, carbides and DLC in thin film form in the range of hundred to several thousand angstrom thick at or close to room temperature (i.e. <<100° C.). The invention utilizes a Metallo-Organic Plasma Enhanced Chemical Vapor Deposition (MOPECVD) vacuum technique that can process materials at low temperatures in the range of 25° to 100° C. only with the appropriate choice of organometallic reactants. These reactants include Disilylhexane, Dimethyl aluminum, Alkyl trimethyl aluminum, and trimethyl titanium. The MOPECVD technique is a plasma based process and can be either Radio Frequency (13.5 Mhz), Microwave (2.54 GHz) or Optical (hv>5 eV) plasma based. The thin film materials deposited are amorphous analogues of high temperature hard wear coatings commonly deposited on high temperature bearing substrates such as steels, ceramics and glasses using high temperature processes (i.e. >250° C.). These amorphous materials include inorganic nitrides such as silicon nitride, inorganic oxides such as silicon dioxide and aluminum oxide, inorganic oxynitrides such as silicon oxynitrides, inorganic carbides such as silicon carbide and titanium carbide, inorganic oxycarbides such as silicon oxycarbides, Diamond Like Carbon (DLC) and doped variations of DLC such as DLC doped with silicon and nitrogen.

According to a feature of the present invention there is provided a plastic structure comprising:

a plastic media, such as a plastic card; and a thin film amorphous inorganic or DLC coating on said plastic media, said coating being hard, transparent or semi-transparent, and wear resistant.

According to another feature of the present invention there is provided plastic media having a thin film protective coating applied by the method comprising the steps of:

flowing a reactive gas past plastic media supported within a chamber, the gas including one or more components for forming an inorganic or DLC coating on the media; and applying a plasma producing energy to the reactive gas, at or near room temperature, to cause an amorphous inorganic or DLC thin film protective coating to be formed on said media by chemical vapor deposition.

ADVANTAGEOUS EFFECT

The present invention has the following advantages, among others.

1. Improved protection from mechanical wear such as scratching and deterioration.

2. Improved protection for optical features and optical signatures.

3. Media can be coated using easy and convenient manufacturing processes that can be applied in large batch modes, thus reducing cost.

DESCRIPTION OF THE DRAWINGS

FIGS. 3 and 4 are diagrammatic views of products of the present invention.

FIG. 5 is a table useful in comparing the method used in carrying out the present invention with a conventional method.

FIG. 6 is a table listing parameters for carrying out the present invention.

DESCRIPTION OF THE PREFERRED EMBODIMENTS

Figure 1:
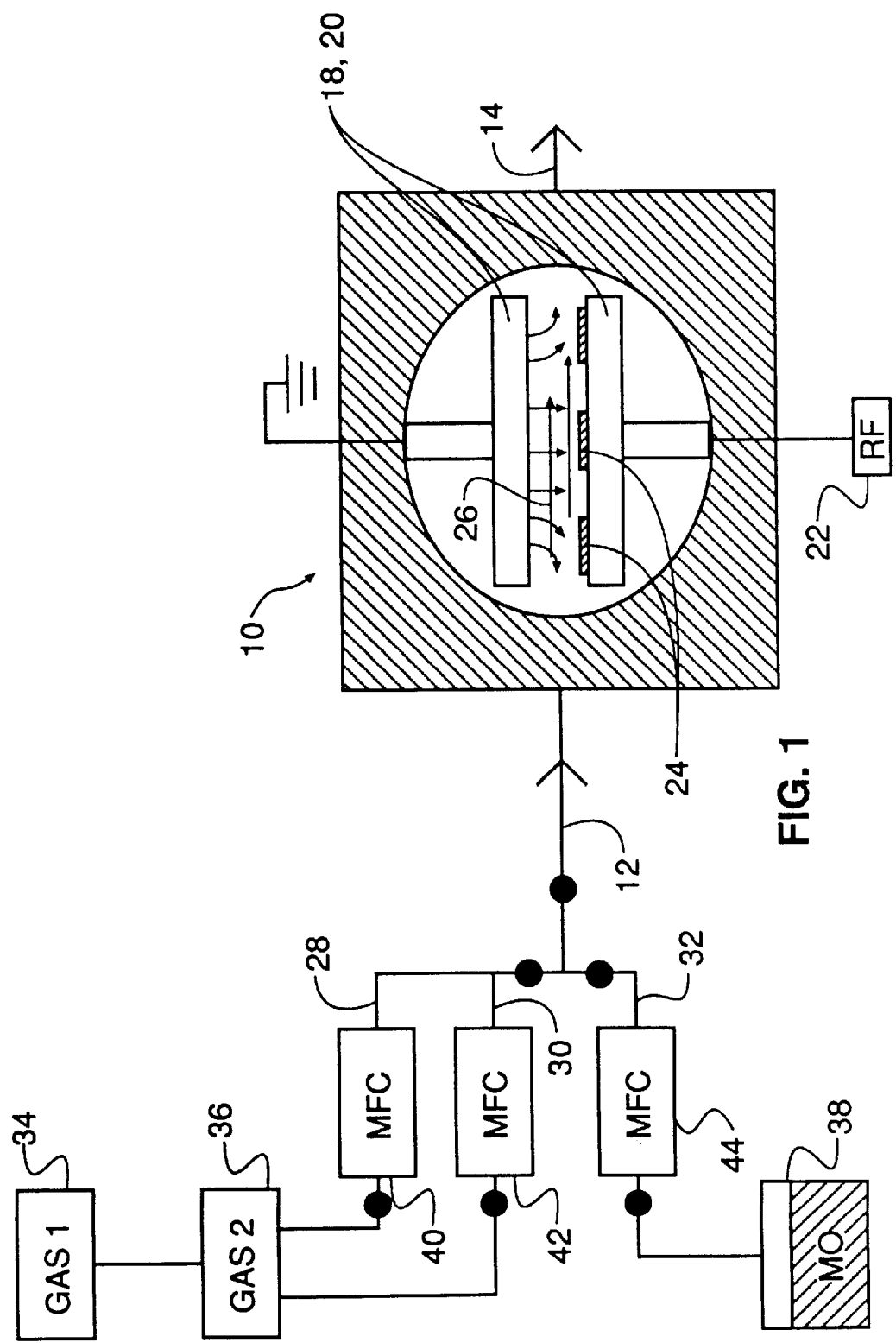
FIG. 1 is a diagrammatic view of a system for carrying out the present invention.

Referring now to FIG. 1, there is shown a system for carrying out the present invention. As shown, a closed chamber 10 has inlet and outlet gas conduits 12 and 14. Positioned within chamber 10 is a radio frequency energy source 16 including paralleled electrodes 18,20. Electrode 18 is electrically connected to ground and electrode 20 is electrically connected to a radio frequency energy source 22. Positioned on plate 20 are objects 24 (such as plastic cards), to be coated with a hard protective coating.

A reactive gas is flowed past objects 24 in the direction of arrows 26 from inlet conduit 12 to outlet conduit 14. The reactive gases are supplied over conduits 28,30,32 from gas sources 34,36,38 respectively, to inlet conduit 12. Mass flow controllers (MFC) 40,42,44 control the flow of gases through conduits 34,36,38, respectively. As shown, gas source 38 contains a high vapor pressure organometallic material such as 2,5 Disilahexane (DSH) or carbon based organic gases such as methane.

Secondary reactant gases from sources 34 and 36 are introduced to establish the plasma chemistry within the process. Typical secondary reactant gases are molecular Hydrogen, molecular Nitrogen, molecular Oxygen. The RF processing conditions such as system pressure, forward applied RF power, and inter-electrode spacing are adjusted to optimize the chemistry within the plasma.

For the case of the oxide, carbide and nitride based inorganic coatings of silicon, the optimum organometallic source Disilahexane is used in the presence of: a) molecular Nitrogen to apply an amorphous film of Silicon Nitride, b) molecular Nitrogen and Oxygen to apply an amorphous film of Silicon Oxynitride, c) molecular Oxygen to apply an amorphous film of Silicon Oxide, d) molecular Hydrogen or Argon to apply an amorphous film of Silicon Carbide. Typical processing conditions are as follows: RF power density is equal to or greater than 1.5 Watts/cm$^2$, system pressure in the range of 75 to 1500 mTorr, electrode gap spacing of 2.0 cm, a flow rate of 3 sccm DSH, a flow rate of 50 sccm of Methane, a flow rate of 100 to 200 sccm Hydrogen, a flow rate of 50 sccm Oxygen, a flow of 100 sccm Nitrogen, and a flow rate of 60 to 100 sccm Argon. Under these conditions, typically 950 to 1000 A of material is deposited per minute.

For amorphous DLC films, Methane is typically used in the presence of; a) molecular Hydrogen and/or Argon to apply an amorphous film of DLC, b) DSH plus molecular Hydrogen and/or Argon to apply a silicon doped film of DLC, and c) molecular Nitrogen to apply a nitrogen doped DLC film. Under these conditions, typically 100 to 500 A per minute is deposited.

FIG. 6 shows in tabular form the preferred parameters for carrying out the method for applying the coating of the invention for DLC and doped DLC (left table) and for a -SiOX:H, a-SiX:H (X=C,N) (right table).

The object 24 which is coated in chamber 10 can be any object, such as plastic media. As shown in FIG. 4, object 24 includes a substrate of 50 to which is applied protective coating 52. Substrate 50 can be of high melting material, such as metal, or of a low melting material, such as plastic, since the method of the invention is carried out at or near room temperature (<100° C.). In a preferred application, the object to be coated is a security card (such as credit card, debit card, personal ID card, security pass, smart card). As shown in FIG. 3, a security card 60 includes a solid plastic body 62, having magnetic particles 64 uniformly dispersed throughout body 62. A protective coating 64 is applied to body 60 according to the present invention. Card 60 is advantageous in that information may be magnetically encoded anywhere on either face or any edge of the card. Card 60 can be a plastic card having a magnetic strip and optical features which are overcoated with the inventive coating.

The protective properties of the inventive coatings were measured and approach the properties of their high temperature analogues. These coatings are hard, wearable, transparent to semi-transparent to visible light, flexible, adhere extremely well to plastic substrates and resistant to harsh chemical attack. The surface of the coated cards and the surface of the untreated cards were exposed to solvents such as isopropyl alcohol and acetone. The coated card were impervious to the solvent attack while the untreated cards experienced chemical attack and distortion of the printed image. The coated cards and new untreated cards were then subjected to a series of swipes through a magnetic reader. Severe scratching was observed on the untreated card while the treated cards remained free of such wear.

FIG. 5 illustrates the differences between the standard (conventional) RFPECVD method and the method used in applying the present invention.

Figure 2:
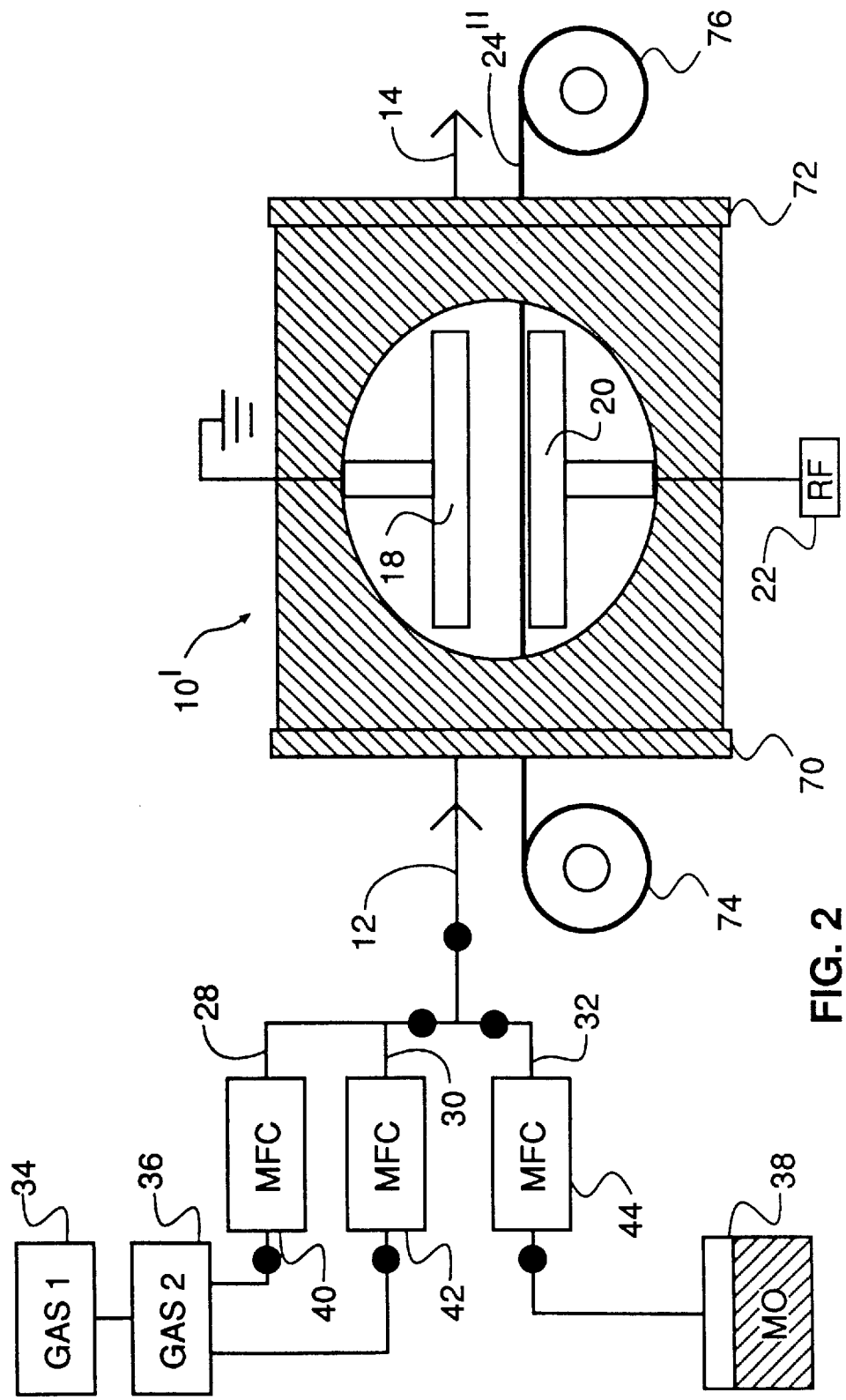
FIG. 2 is a diagrammatic view of another system for carrying out the present invention.

Referring now to FIG. 2 there is shown another system for carrying out the present invention. The system of FIG. 2 is substantially the same as the system of FIG. 1 except for the object to be coated. In FIG. 2, chamber 10' is provided with curtain walls 70,72 so that a continuous web 24" of material can be coated according to the invention. As shown, web 24" is transported through chamber 10" from roll 74 to roll 76.

Following are typical material processing examples according to the invention.

EXAMPLE 1

DLC:N

| Reactants: | Flow Rates: (SCCM) |
|---|---|
| CH$_4$ | 50 |
| N$_2$ | 35 |
| Ar | 50 |

System Pressure: 1000 mTorr

Power Density: 1.68 Watt/cm$^2$

Film Properties: Index: 1.93

Temperature: Room Temp.
   Hardness: 12–1300 Knoop

EXAMPLE 2 a-SiC:H

| Reactants: | Flow Rates: (SCCM) |
|---|---|
| DSH | 3 |
| CH$_4$ | 5 |
| H$_2$ | 200 |
| Ar | 25 |

System Pressure: 1000 mTorr

Power Density: 1.68 Watt/cm$^2$

Film Properties: Index: 2.01
Temperature: Room Temp.
Hardness: >2500 Knoop

EXAMPLE 3 a-SiOC:H

| Reactants: | Flow Rates: (SCCM) |
|---|---|
| DSH | 6 |
| $O_2$ | 8 |
| $N_2$ | 100 |

System Pressure: 75 mTorr
Power Density: 1.59 Watt/cm$^2$
Film Properties: Index: 2.03
Temperature: Room Temp.
Hardness: 2600–2800 Knoop

EXAMPLE 4 a-SiN:H

| Reactants: | Flow Rates: (SCCM) |
|---|---|
| DSH | 3 |
| $N_2$ | 50 |
| Ar | 100 |

System Pressure: 115 mTorr
Power Density: 1.68 Watt/cm$^2$
Film Properties: Index: 2.15
Temperature: Room Temp.
Hardness: >2900 Knoop The invention has been described in detail with particular reference to preferred embodiments thereof, but it will be understood that variations and modifications can be effected within the spirit and scope of the invention.

parts list
10 closed chamber
10' chamber
12,14 outlet gas conduits
18,20 parallel electrodes
22 radio frequency energy source
24 object
24' object
24" continuous web
26 arrows
28,30,32 conduit
34,36,38 gas sources
40,42,44 mass flow controllers
50 substrate
52 protective coating
60 security card
62 solid plastic body
64 magnetic particles
70,72 curtain walls
74 roll
76 roll

What is claimed is:

1. A plastic structure comprising;
a plastic media constituting a solid plastic card having major opposing surfaces and edges joining said surfaces, having magnetic particles uniformly dispersed throughout the solid plastic card, and having magnetic encoding capability; and
a thin film amorphous inorganic or DLC coating on said plastic media, said coating being hard, transparent or semi-transparent, and wear resistant.

2. The plastic structure of claim 1 wherein said plastic media comprises a plastic card having a magnetic stripe which is covered by said coating.

3. The plastic structure of claim 1 wherein said plastic media are of one or more of the following materials: polystyrenes, polyesters, polyurethanes, polyamides, PVC (poly-vinyl chloride), polycarbonates, PET (poly-ethylene terphthalate), polyolefins, and PEN (poly-ethylene napthalate).

4. The plastic structure of claim 1 wherein said amorphous inorganic or DLC coating includes one or more of the following: inorganic nitrides, including silicon nitride; inorganic oxides, including silicon dioxide and aluminum oxide; inorganic oxynitrides including silicon oxynitrides; inorganic carbides including silicon carbide and titanium carbide; inorganic oxycarbides including silicon oxycarbides; DLC and doped variations of DLC including DLC doped with silicon and nitrogen.

5. The plastic structure of claim 1 wherein said coating is applied by a method comprising the steps of:
flowing a reactive gas past said plastic media supported within a chamber, said gas including one or more components for forming an inorganic or DLC coating on said media; and
applying a plasma producing energy to said reactive gas, at or near room temperature, to cause an amorphous inorganic or DLC thin film protective coating to be formed on said media by chemical vapor deposition.

6. The structure of claim 5 wherein said plasma producing energy is one of radio frequency energy, microwave energy, or laser energy.

7. The structure of claim 6 wherein said reactive gas includes disilahexane and nitrogen gases and said protective coating formed is silicon nitride.

8. The structure of claim 5 wherein said reactive gas includes disilahexane and nitrogen and oxygen gases and said protective coating formed is silicon oxynitride.

9. The structure of claim 5 wherein said reactive gas includes disilahexane and oxygen gases and said protective coating formed is silicon oxide.

10. The structure of claim 5 wherein said reactive gas includes disilahexane and hydrogen or argon gases and said protective coating formed is silicon carbide.

11. The structure of claim 5 wherein said reactive gas includes methane and hydrogen and/or argon and said protective coating formed is amorphous diamond-like carbon.

12. The structure of claim 5 wherein said reactive gas includes methane and disilahexane and hydrogen and/or argon and said protective coating formed is silicon doped diamond-like carbon.

13. The structure of claim 5 wherein said reactive gas includes methane and nitrogen and said protective coating formed is nitrogen doped diamond-like carbon.

14. The structure of claim 5 wherein said plasma producing energy is radio-frequency energy applied at a power density equal to or greater than 1.5 watts per centimeters$^2$ and at a system pressure of 75 to 1500 mTorr.

* * * * *